US011488915B2

(12) United States Patent
Chen et al.

(10) Patent No.: US 11,488,915 B2
(45) Date of Patent: Nov. 1, 2022

(54) ANTENNA PACKAGE STRUCTURE AND ANTENNA PACKAGING METHOD

(71) Applicant: SJ Semiconductor (Jiangyin) Corporation, JiangYin (CN)

(72) Inventors: Yenheng Chen, JiangYin (CN); Chengchung Lin, JiangYin (CN); Chengtar Wu, JiangYin (CN); Jangshen Lin, JiangYin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 15 days.

(21) Appl. No.: 17/243,370

(22) Filed: Apr. 28, 2021

(65) Prior Publication Data

US 2021/0249370 A1 Aug. 12, 2021

Related U.S. Application Data

(62) Division of application No. 16/407,527, filed on May 9, 2019, now Pat. No. 11,114,391.

(30) Foreign Application Priority Data

May 9, 2018 (CN) .......................... 201810437557.X
May 9, 2018 (CN) ........................... 201820685341.0

(51) Int. Cl.
| | |
|---|---|
| *H01L 21/56* | (2006.01) |
| *H01L 23/66* | (2006.01) |
| *H01L 23/498* | (2006.01) |
| *H01L 21/48* | (2006.01) |
| *H01Q 1/22* | (2006.01) |
| *H01Q 1/38* | (2006.01) |

(52) U.S. Cl.
CPC .......... *H01L 23/66* (2013.01); *H01L 21/4853* (2013.01); *H01L 21/4857* (2013.01); *H01L 21/568* (2013.01); *H01L 23/49811* (2013.01); *H01L 23/49822* (2013.01); *H01L 23/49838* (2013.01); *H01L 23/49866* (2013.01); *H01L 23/49894* (2013.01); *H01Q 1/2283* (2013.01); *H01Q 1/38* (2013.01); *H01L 2223/6677* (2013.01)

(58) Field of Classification Search
CPC ....... H01L 21/48; H01L 21/56; H01L 23/498; H01L 23/66
USPC ......................................................... 257/428
See application file for complete search history.

(56) References Cited

U.S. PATENT DOCUMENTS

2019/0058241 A1* 2/2019 So ........................... H01L 24/20

* cited by examiner

*Primary Examiner* — Fazli Erdem
(74) *Attorney, Agent, or Firm* — Alston & Bird LLP

(57) ABSTRACT

The present disclosure provides an antenna package structure and an antenna packaging method. The package structure includes a rewiring layer, wherein the rewiring layer comprises a first dielectric layer and a first metal wiring layer in the first dielectric layer; metal connecting column, formed on the first metal wiring layer of the rewiring layer; a packaging layer, disposed on the rewiring layer, an antenna metal layer, formed on the packaging layer, an antenna circuit chip, bonded to the first metal layer of the rewiring layer, and electrically connected to the antenna metal layer through the metal connecting column; and a metal bump, formed on the first metal wiring layer of the rewiring layer, to achieve electrical lead-out of the rewiring layer.

8 Claims, 3 Drawing Sheets

ANTENNA PACKAGE STRUCTURE AND ANTENNA PACKAGING METHOD

CROSS REFERENCES TO RELATED APPLICATIONS

This application claims the benefit of priority to U.S. patent application Ser. No. 16/407,527, filed on May 9, 2019, entitled "Antenna Package Structure and Antenna Packaging Method", Chinese Patent Application No. CN201810437557X, entitled "Antenna Package Structure and Antenna Packaging Method", filed with SIPO on May 9, 2018, and Chinese Patent Application No. CN2018206853410, entitled "Antenna Package Structure", filed with SIPO on May 9, 2018, the contents of which are incorporated herein by reference in its entirety.

TECHNICAL FIELD

The present disclosure relates to the field of semiconductor packaging, and in particular, to an antenna package structure and an antenna packaging method.

BACKGROUND

With the advancement of science and technologies, various high-tech electronic products, including various electronic apparatuses such as notebook computers, mobile phones, and tablet computers (PAD), are developed to meet people's needs.

In addition to significant increases in functions and applications enabled by these high-tech products, a wireless communication function is added to meet mobile device requirements. Therefore, people may use these high-tech electronic products anywhere or anytime because of the wireless communication functions. Flexibility and convenience of these high-tech electronic products have been significantly improved, people no longer need to call from limited areas, and people's lives are actually benefited because of application of these electronic products.

In general, existing antenna structures on IC circuits include dipole antenna, monopole antenna, patch antenna, planar inverted-F antenna, meander line antenna, inverted-L antenna, loop antenna, spiral antenna, spring antenna, and the like. A known approach is directly manufacturing an antenna on a surface of a circuit board. In this approach, the antenna may occupy an additional area of the circuit board, which is relatively undesirable. For various electronic apparatus, a large circuit board results in a large electronic apparatus. However, a main purpose of designing and developing these electronic apparatus is to enable a user to conveniently carry the electronic apparatuses. Therefore, a problem to be solved is to reduce an area of a circuit board having an antenna structure with improved integration performance.

Based on the foregoing descriptions, it is necessary to provide an antenna package structure and an antenna packaging method which have high integration level.

SUMMARY

The present disclosure provides an antenna package structure. The package structure comprises: a rewiring layer, a rewiring layer, wherein the rewiring layer comprises a first dielectric layer and a first metal wiring layer in the first dielectric layer; a metal connecting column, formed on the first metal wiring layer of the rewiring layer; a packaging layer, disposed on the rewiring layer, an antenna metal layer, formed on the packaging layer, wherein the metal connecting column connects the first metal wiring layer at one end to the antenna metal layer at the other end; an antenna circuit chip, bonded to the first metal layer of the rewiring layer, and electrically connected to the antenna metal layer through the metal connecting column; and a metal bump, formed on the first metal wiring layer of the rewiring layer, to achieve electrical lead-out of the rewiring layer.

Preferably, a second dielectric layer is formed on a surface of the packaging layer, wherein the metal connecting column has a protruding portion protruding from the packaging layer and exposing from the second dielectric layer, and wherein the antenna metal layer is formed on an upper surface of the second dielectric layer.

Preferably, the second dielectric layer has a planar top surface, which is in a same plane with the top surface of the metal connecting column.

Preferably, the material of the packaging layer comprises one of polyimide (PI), silica gel, and epoxy resin.

Preferably, the rewiring layer comprises the rewiring layer comprises a first dielectric layer, a first metal wiring layer.

Further, the material of the first dielectric layer and the second dielectric layer comprises one or a combination of epoxy resin, silica gel, PI, PBO, BCB, silica, phosphosilicate glass, and fluorine-containing glass, and the material of the metal wiring layer comprises one or a combination of copper, aluminum, nickel, gold, silver, and titanium.

Preferably, the material of the metal connecting column comprises one of Au, Ag, Cu, and Al.

Preferably, the metal bump comprises one of a tin solder, a silver solder, and a gold-tin alloy solder.

The present disclosure further provides an antenna packaging method. The packaging method comprises steps of: 1) providing a support substrate, and forming a separation layer on the support substrate; 2) forming a rewiring layer on the separation layer, wherein the rewiring layer has a first surface connected to the separation layer and a second surface opposite to the first surface, wherein the rewiring layer comprises a first metal wiring layer and a first dielectric layer; 3) forming a metal connecting column on the first metal wiring layer of the rewiring layer; 4) disposing a packaging layer on the rewiring layer, and thinning the packaging layer, so that a top surface of the metal connecting column is exposed from the packaging layer; 5) forming an antenna metal layer on the packaging layer, wherein the antenna metal layer is connected to the metal connecting column; 6) stripping off the separation layer to remove the support substrate, and to expose the first surface of the rewiring layer; 7) providing an antenna circuit chip, and bonding the antenna circuit chip to the first metal wiring layer of the rewiring layer, so that the antenna circuit chip is electrically connected to the antenna metal layer from the first metal wiring layer and the metal connecting column; and 8) forming a metal bump on the first metal wiring layer of the rewiring layer, to form electrical lead-out of the rewiring layer.

Preferably, in the step 4), the packaging layer is thinned, so that the metal connecting column has a protruding portion protruding from the packaging layer, and a dielectric layer is formed on a surface of the packaging layer, where the top surface of the metal connecting column is exposed from the dielectric layer; and in the step 5), the antenna metal layer is formed on a surface of the dielectric layer.

Preferably, the second dielectric layer is formed on the surface of the packaging layer, and a planarization treatment is performed over the second dielectric layer, to expose the top surface of the metal connecting column.

Preferably, the support substrate comprises one of a glass substrate, a metal substrate, a semiconductor substrate, a polymer substrate, and a ceramic substrate, the separation layer comprises one of an adhesive tape and a polymer layer, and the polymer layer is coated on a surface of the support substrate by using a spin-coating process, and then is cured by using an ultra-violet curing process or a thermos-curing process.

Preferably, the step 2) of making the rewiring layer comprises steps of: 2-1) forming the first dielectric layer on a surface of the separation layer by using a chemical vapor deposition process or a physical vapor deposition process, and etching the first dielectric layer to pattern a first dielectric layer; 2-2) forming the first metal wiring layer on a surface of the first dielectric layer by using a chemical vapor deposition process, an evaporation process, a sputtering process, an electroplating process, or an electroless plating process, and etching the metal layer to form a patterned metal wiring layer; and 2-3) forming the first dielectric layer on a surface of the first metal wiring layer by using a chemical vapor deposition process or a physical vapor deposition process, and etching the first dielectric layer to pattern the first dielectric layer, wherein the metal connecting column passes through the first dielectric layer and connects to the first metal wiring layer.

Further, the material of the first dielectric layer and the second dielectric layer comprises one or a combination of epoxy resin, silica gel, PI, PBO, BCB, silica, phosphosilicate glass, and fluorine-containing glass, and the material of the first metal wiring layer comprises one or a combination of copper, aluminum, nickel, gold, silver, and titanium.

Preferably, in the step 3), the metal connecting column is disposed by using a wire bonding process, where the wire bonding process comprises one of a thermal compression wire bonding process, an ultrasonic wire bonding process, and a thermal compression ultrasonic wire bonding process, and the material of the metal connecting column comprises one of Au, Ag, Cu, and Al.

Preferably, in the step 4), a method for insulating the metal connecting column by using the packaging layer comprises one of compression molding, transfer molding, liquid seal molding, vacuum lamination, and spin-coating, and the material of the packaging layer comprises one of PI, silica gel, and epoxy resin.

Preferably, in the step 6), a method for stripping off the the separation layer and removing the support substrate comprises one of mechanical stripping and chemical stripping.

Preferably, the metal bump comprises one of a tin solder, a silver solder, and a gold-tin alloy solder.

DESCRIPTIONS OF REFERENCE NUMERALS

Figure 1:
FIGS. 1-9 are structural schematic views in each major step during packaging process of an antenna according to the present disclosure.

101 Support substrate
102 Separation layer
103 Antenna circuit chip
105 Rewiring layer
106 Metal connecting column
107 Packaging layer
108 Antenna metal layer
109 Metal bump
110 Third Dielectric layer
1061 protruding portion
1051 First dielectric layer
1052 Second dielectric layer
1053 First metal wiring layer

DETAILED DESCRIPTION OF THE PREFERRED EMBODIMENTS

Implementations of the present disclosure are described below by using particular and specific examples, and a person skilled in the art can easily understand other advantages and efficacy of the present disclosure from content disclosed in the specification. The present disclosure can further be implemented or applied by using other different specific implementations, details in the specification can also be based on different opinions and applications, and various modifications and changes can be made without departing the spirit of the present disclosure.

It should be noted that, figures provided in embodiments describe the basic idea of the present disclosure only in a schematic manner; only components related to the present disclosure are shown in the figures instead of drawing components based on the quantity, the shape, and the size of the components required during actual implementation; and the shape, the quantity, and the ratio of each component during actual implementation can be changed randomly, and the layout shape of the components may be more complex.

As shown in FIG. 1 to FIG. 10, an antenna packaging method is provided step by step. The packaging method comprises the following steps.

As shown in FIG. 1, step 1): providing a support substrate 101, and forming a separation layer 102 on the support substrate 101.

In an example, the support substrate 101 comprises one of a glass substrate, a metal substrate, a semiconductor substrate, a polymer substrate, and a ceramic substrate. In this embodiment, the support substrate 101 is a glass substrate. The glass substrate is low cost, it is easy to form the separation layer 102 on a surface of the glass substrate, and a difficulty of a subsequent stripping process is reduced.

In an example, the separation layer 102 comprises one of an adhesive tape and a polymer layer. The polymer layer is coated on a surface of the support substrate 101 by using a spin-coating process, and then is cured by an ultra-violet curing process or a thermo-curing process.

In this embodiment, the separation layer 102 is thermos-curing adhesive. The thermos-curing adhesive is formed on the support substrate 101 by using the spin-coating process, and then is cured by using the thermos-curing process. The thermos-curing adhesive has stable performance, a relatively smooth surface, which facilitates making of a subsequent rewiring layer. In addition, in a subsequent stripping process, a stripping difficulty is relatively low.

Figure 2:
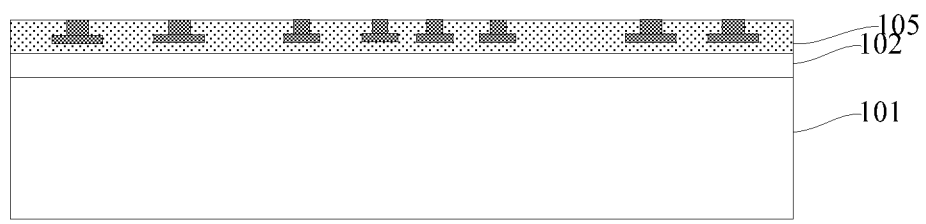

As shown in FIG. 2, step 2): forming a rewiring layer 105 on the separation layer 102, wherein the rewiring layer 105 comprises a first surface connected to the separation layer and a second surface opposite to the first surface.

The step 2) of forming the rewiring layer 105 comprises the following steps.

Step 2-1), Forming a first dielectric layer 1051 on a surface of the separation layer 102 by using a chemical vapor deposition process or a physical vapor deposition process, and etching the dielectric layer to pattern the first dielectric layer. The material of the first dielectric layer 1051 comprises one or a combination of epoxy resin, silica gel, Polyimide (PI), Polybenzoxazole (PBO), Benzocyclobutene (BCB), silica, phosphosilicate glass, and fluorine-containing glass.

Preferably, the material of the first dielectric layer 1051 is PI, to further reduce a process difficulty and process costs.

Step 2-2), Forming a first metal layer 1051 on a surface of the patterned first dielectric layer by using a chemical vapor deposition process, an evaporation process, a sputtering process, an electroplating process, or an electroless plating process, and etching the first metal wiring layer 1053 to pattern the first metal wiring layer 1053. The material of the first metal wiring layer 1053 comprises one or a combination of copper, aluminum, nickel, gold, silver, and titanium. The combined structure after step 2 is the rewiring layer 105.

Step 3), Forming a second dielectric layer 1052 on a surface of the patterned first metal layer 1053 by using a chemical vapor deposition process or a physical vapor deposition process, and etching the second dielectric layer to pattern the second dielectric layer 1052. The material of the second dielectric layer 1052 comprises one or a combination of epoxy resin, silica gel, PI, PBO, BCB, silica, phosphosilicate glass, and fluorine-containing glass.

Preferably, the material of the second dielectric layer 1052 is PI, to further reduce a process difficulty and process costs.

Figure 3:
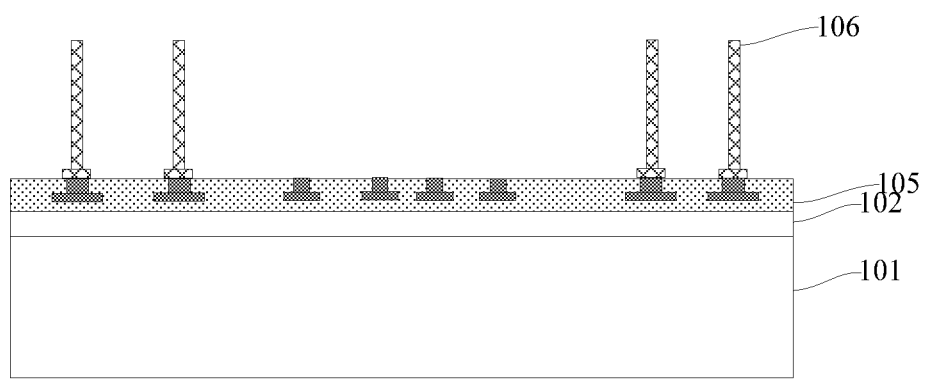

As shown in FIG. 3, step 3): forming a metal connecting column 106 to connect electrically to the first metal wiring layer 1053 in the rewiring layer 105.

The metal connecting column 106 is made by a wire bonding process. The wire bonding process comprises one of a thermal compression wire bonding process, an ultrasonic wire bonding process, and a thermal compression ultrasonic wire bonding process. The material of the metal connecting column 106 comprises one of Au, Ag, Cu, and Al. For example, the metal connecting column 106 may be Al, and welding can be completed at a relatively low temperature by using the ultrasonic wire bonding process, thereby greatly lowering a process temperature. For another example, the metal connecting column 106 may be Au to obtain excellent electrical conductivity performance.

Figure 4:
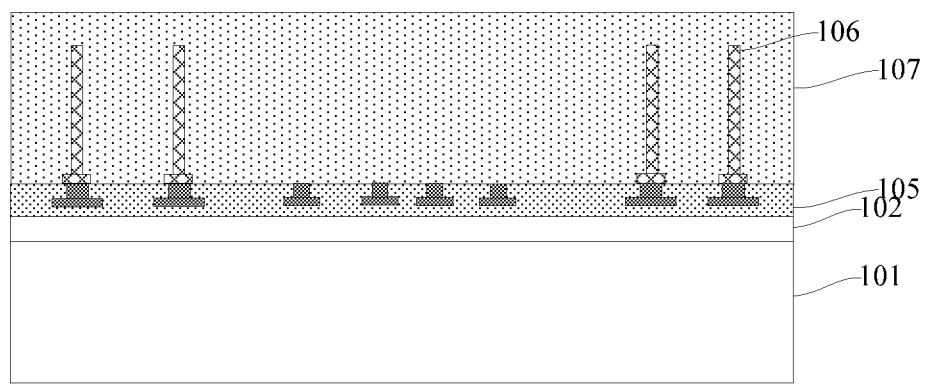
Figure 5:
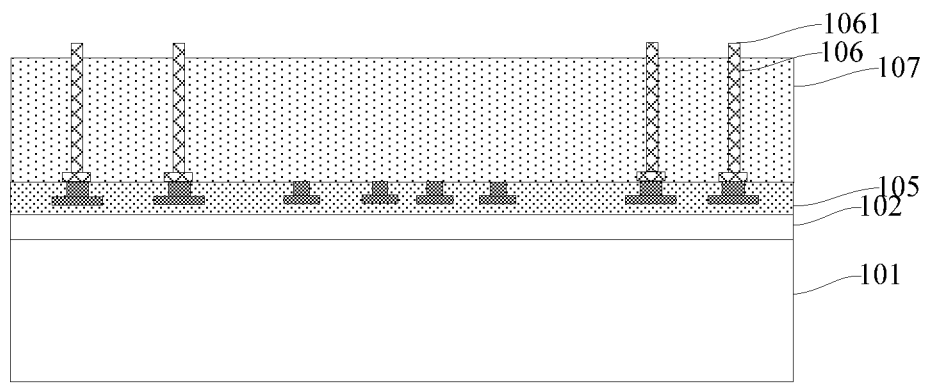
Figure 6:
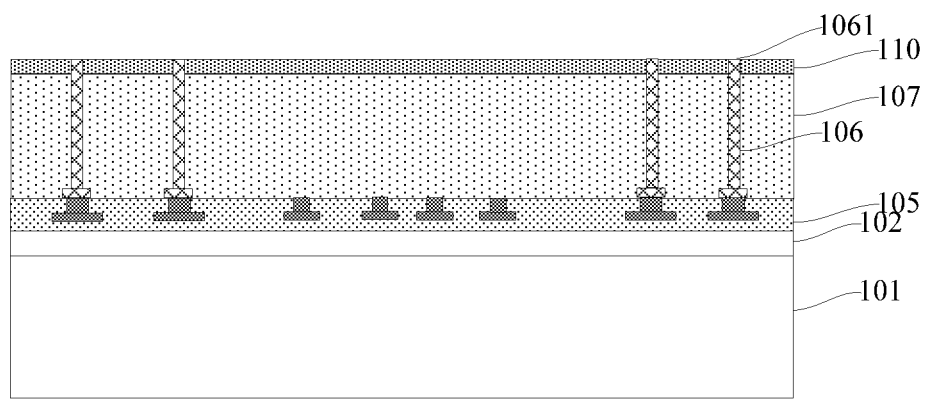

As shown in FIG. 4 to FIG. 6, step 4): wrapping the metal connecting column 106 by using a packaging layer 107, then thinning the packaging layer 107, such that a top surface of the metal connecting column 106 is exposed from the packaging layer 107.

In an example, packaging the antenna structure by using the packaging layer 107 comprises one of compression molding, transfer molding, liquid seal molding, vacuum lamination, and spin-coating. The material of the packaging layer 107 comprises one of PI, silica gel, and epoxy resin.

Figure 11:
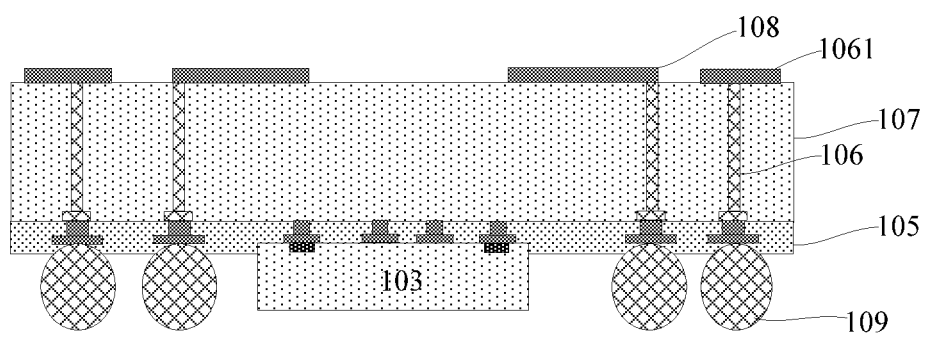
FIG. 11 is a structural schematic view of another antenna package structure according to the present disclosure.

In this embodiment, the packaging layer 107 is thinned, such that the metal connecting column 106 has a protruding portion 1061 protruding from the packaging layer, as shown in FIG. 5. A third dielectric layer 110 is formed on a surface of the packaging layer 107. The top surface of the metal connecting column 106 is exposed from the third dielectric layer 110, as shown in FIG. 6. Specifically, first, the third dielectric layer 110 covering the metal connecting column 106 is formed on the surface of the packaging layer 107, and then planarization treatment is performed to the third dielectric layer 110, to cause the top surface of the metal connecting column 106 is exposed from the third dielectric layer 110. An upper surface of the third dielectric layer 110 and the top surface of the metal connecting column 106 are in a same plane. The material of the third dielectric layer 110 may be an organic dielectric layer, for example, PI, or may be an inorganic dielectric layer, for example, silica. The third dielectric layer 110 having a planar surface can effectively improve quality of a subsequent antenna metal layer 108, and improve antenna efficiency and stability. Certainly, according to an actual requirement, the third dielectric layer 110 may be omitted, and the subsequent antenna metal layer 108 is directly manufactured on the surface of the packaging layer 107, as shown in FIG. 11.

Figure 7:
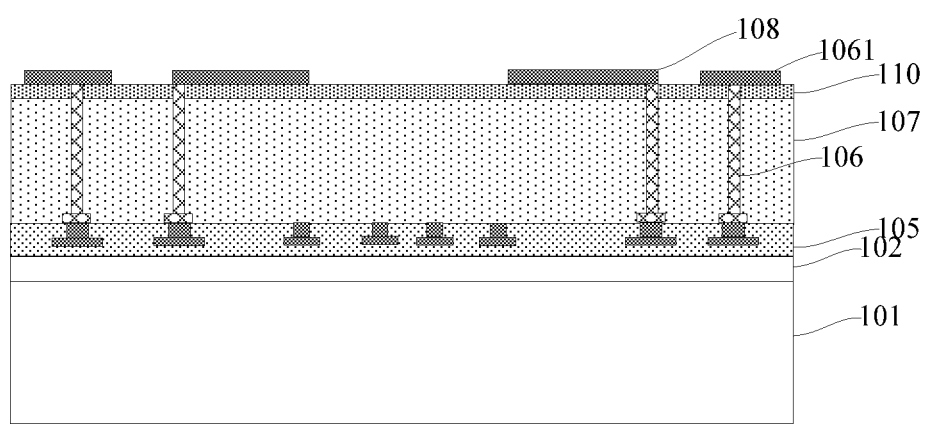

As shown in FIG. 7, step 5): forming the antenna metal layer 108 on a surface of the third dielectric layer 110, wherein the antenna metal layer 108 is connected to the metal connecting column 106.

Figure 8:
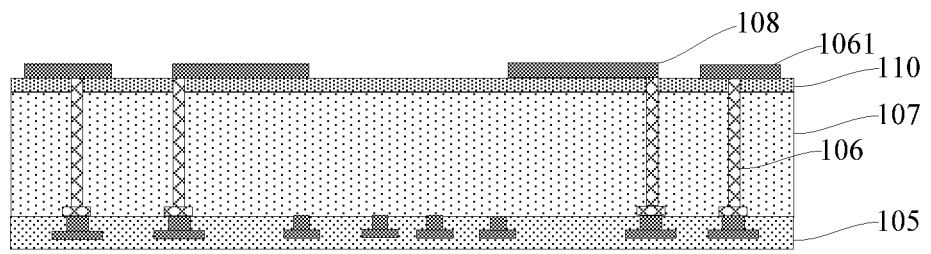

As shown in FIG. 8, step 6): stripping off the separation layer 102 and removing the support substrate 101, to expose the first surface of the rewiring layer 105.

In an example, the separation layer 102 and the support substrate 101 may be separated according to an attribute of the separation layer 102 by using a method such as mechanical stripping, laser stripping, or chemical stripping (such as wet etching).

Figure 9:
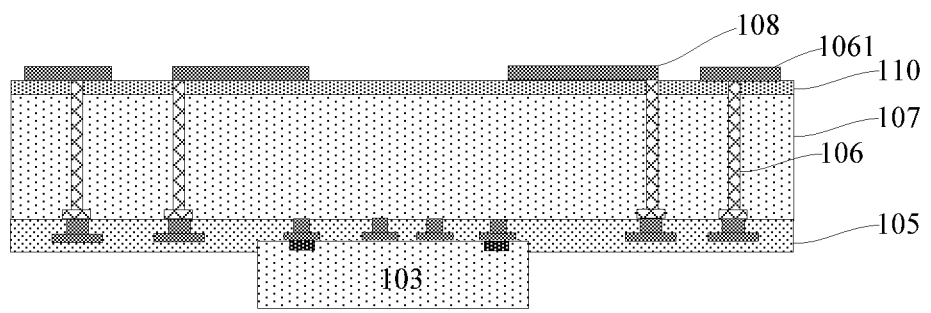

As shown in FIG. 9, step 7): providing an antenna circuit chip 103, and bonding the antenna circuit chip 103 to the first metal wiring layer in the rewiring layer 105, so that the antenna circuit chip 103 is electrically connected to the antenna metal layer 108 by using the rewiring layer 105 and the metal connecting column 106. For example, the antenna circuit chip 103 may be bonded to the first surface of the rewiring layer 105 by using a welding process, so that the antenna circuit chip 103 is electrically connected to the rewiring layer 105.

Figure 10:
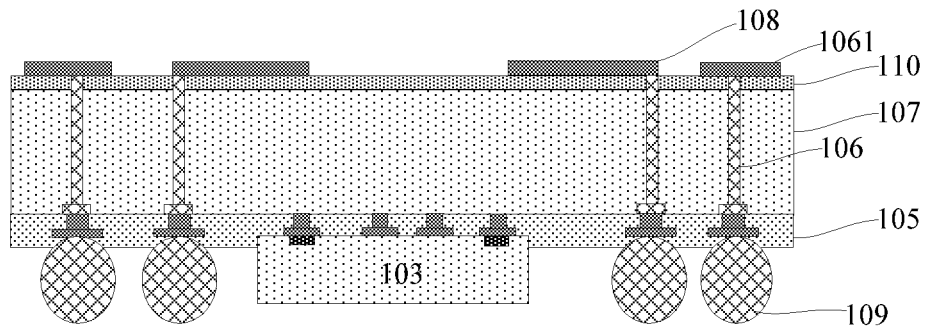
FIG. 10 is a structural schematic view of the completed antenna package structure according to the present disclosure

As shown in FIG. 10, step 8): forming a metal bump 109 on the first metal wiring layer of the rewiring layer 105, to achieve electrical lead-out of the rewiring layer 105.

As shown in FIG. 10, this embodiment further provides an antenna package structure, comprising an antenna circuit chip 103, a rewiring layer 105, a metal connecting column 106, a packaging layer 107, an antenna metal layer 108, and a metal bump 109.

As shown in FIG. 10, the rewiring layer 105 comprises a first surface and a second surface opposite to the first surface.

In an example, the rewiring layer 105 comprises a first patterned dielectric layer, a patterned metal wiring layer, and a second patterned dielectric layer, the metal connecting column 106 passes through the second patterned dielectric layer and is connected to the patterned metal wiring layer. The material of the first dielectric layer and the second dielectric layer comprises one or a combination of epoxy resin, silica gel, PI, PBO, BCB, silica, phosphosilicate glass, and fluorine-containing glass, and the material of the metal wiring layer comprises one or a combination of copper, aluminum, nickel, gold, silver, and titanium.

As shown in FIG. 10, the metal connecting column 106 is formed on the second surface of the rewiring layer 105.

As shown in FIG. 10, the packaging layer 107 encloses the antenna structure and the metal connecting column 106, and a top surface of the metal connecting column 106 is exposed from the packaging layer 107.

The material of the packaging layer 107 comprises one of PI, silica gel, and epoxy resin.

As shown in FIG. 10, a third dielectric layer 110 is further formed on a surface of the packaging layer 107. The metal connecting column 106 has a protruding portion 1061 protruding from the packaging layer 107, and the top surface of the metal connecting column 106 is exposed from the third dielectric layer 110. The antenna metal layer 108 is formed on an upper surface of the third dielectric layer 110, and the antenna metal layer 108 is connected to the metal connecting column 106. The second third dielectric layer 110 has a planar upper surface, which is in a same plane with the top surface of the metal connecting column 106. The third dielectric layer 110 having a planar surface can effectively improve quality of the subsequent antenna metal layer 108, and improve antenna efficiency and stability. The antenna metal layer 108 is formed on the surface of the packaging layer 107.

Certainly, according to an actual requirement, the third dielectric layer 110 may be omitted, and the subsequent antenna metal layer 108 is directly manufactured on the surface of the packaging layer 107, as shown in FIG. 11.

The antenna circuit chip 103 is bonded to the first surface of the rewiring layer 105, and electrically connected to the antenna metal layer 108 by using the rewiring layer 105 and the metal connecting column 106.

The metal bump 109 is formed on the first surface of the rewiring layer 105, to achieve electrical lead-out of the rewiring layer 105.

In an example, the metal bump 109 comprises one of a tin solder, a silver solder, and a gold-tin alloy solder.

As described above, the antenna package structure and the antenna packaging method according to the present disclosure have the following beneficial effects:

Due to the interconnecting rewiring layers, the antenna package structure can be integrated, thereby greatly improving antenna efficiency and performance, and achieving high integration and high packaging efficiency.

An antenna structure is packaged by using a fan-out packaging method in the present disclosure, which effectively reduces a packaging volume, so that the antenna package structure achieves high integration and better packaging performance, and has a wide application prospect in the semiconductor packaging field.

Therefore, the present disclosure effectively overcomes various disadvantages in the prior art and has high industrial utilization value.

The foregoing embodiments are merely intended to exemplarily describe the principles and efficacy of the present disclosure and are not intended to limit the present disclosure. A person skilled in the art can make modifications or changes to the foregoing embodiments without departing from the spirit and scope of the present disclosure. Therefore, any equivalent modifications or changes completed by a person of common knowledge in the art without departing from the spirit and technical thoughts disclosed in the present disclosure shall still fall within the scope of the claims of the present disclosure.

The invention claimed is:
1. An antenna package structure, comprising:
a rewiring layer having a first surface and a second surface, wherein the rewiring layer comprises a first dielectric layer and a first metal wiring layer in the first dielectric layer;
a metal connecting column, formed on the first metal wiring layer of the rewiring layer;
a packaging layer, disposed on the rewiring layer, wherein the metal connecting column has a top portion protruding from a top surface of the packaging layer;
an antenna metal layer, formed on the packaging layer, wherein the metal connecting column connects to the first metal wiring layer in the first dielectric layer of the rewiring layer at one end and to the antenna metal layer the top portion protruding from the top surface of the packaging layer;
an antenna circuit chip having a first surface and a second surface opposite to the first surface, wherein the first surface of the antenna circuit chip is bonded to the surface of the rewiring layer, and electrically connected to the antenna metal layer through the metal connecting column; and
a metal bump, formed on the first metal wiring layer of the rewiring layer, to achieve electrical lead-out of the rewiring layer, wherein the second surface of the antenna circuit chip and the metal bump are both exposed outside of the rewiring layer.

2. The antenna package structure according to claim 1, wherein a second dielectric layer is formed on a surface of the packaging layer, wherein a top surface of said top portion of the metal connecting column exposes from the second dielectric layer, and wherein the antenna metal layer is formed on an upper surface of the second dielectric layer.

3. The antenna package structure according to claim 2, wherein the second dielectric layer has a planar top surface, which is in a same plane with the top surface of the protruding top portion of the metal connecting column.

4. The antenna package structure according to claim 1, wherein the material of the packaging layer comprises one of polyimide (PI), silica gel, and epoxy resin.

5. The antenna package structure according to claim 1, wherein the first dielectric layer and the first metal wiring layer are disposed between the first surface and the second surface of the rewiring layer.

6. The antenna package structure according to claim 2, wherein the material of the first dielectric layer and the second dielectric layer comprises one or a combination of epoxy resin, silica gel, PI, PBO, BCB, silica, phosphosilicate glass, and fluorine-containing glass, and the material of the first metal wiring layer comprises one or a combination of copper, aluminum, nickel, gold, silver, and titanium.

7. The antenna package structure according to claim 1, wherein the material of the metal connecting column comprises one of Au, Ag, Cu, and Al.

8. The antenna package structure according to claim 1, wherein the metal bump comprises one of a tin solder, a silver solder, and a gold-tin alloy solder.

* * * * *